United States Patent [19]

Iwamura et al.

[11] Patent Number: 5,694,330
[45] Date of Patent: Dec. 2, 1997

[54] ERROR CORRECTION METHOD INCLUDING ERASURE CORRECTION, AND APPARATUS THEREFOR

[75] Inventors: Keiichi Iwamura, Kawasaki; Takayuki Aizawa, Yokohama; Izumi Narita, Koganei; Takatoshi Suzuki, Kawasaki, all of Japan

[73] Assignee: Canon Kabushiki Kaisha, Tokyo, Japan

[21] Appl. No.: 230,249

[22] Filed: Apr. 20, 1994

[30] Foreign Application Priority Data

Apr. 21, 1993 [JP] Japan ................... 5-094408

[51] Int. Cl.$^6$ .......................... H03M 13/00
[52] U.S. Cl. .............. 364/496; 371/38.1; 371/39.1
[58] Field of Search ............... 371/37.1, 37.5, 371/37.7, 38.1, 39.1, 37.2

[56] References Cited

U.S. PATENT DOCUMENTS

| | | | |
|---|---|---|---|
| 4,633,470 | 12/1986 | Welch et al. | 371/37 |
| 4,675,869 | 6/1987 | Driessen | 371/37 |
| 4,747,103 | 5/1988 | Iwamura et al. | 371/37 |
| 4,845,713 | 7/1989 | Zook | 371/37 |
| 4,868,828 | 9/1989 | Shao et al. | 371/5.1 |
| 5,020,060 | 5/1991 | Murai et al. | 371/37.1 |
| 5,107,504 | 4/1992 | Nakamura et al. | 371/37.1 |
| 5,170,399 | 12/1992 | Cameron et al. | 371/37.1 |
| 5,313,530 | 5/1994 | Iwamura | 380/28 |
| 5,315,600 | 5/1994 | Iwamura et al. | 371/37.6 |
| 5,365,529 | 11/1994 | Mester | 371/37.1 |
| 5,373,511 | 12/1994 | Veksler | 371/37.4 |

FOREIGN PATENT DOCUMENTS

| | | |
|---|---|---|
| 0133137 | 2/1985 | European Pat. Off. . |
| 0296828 | 12/1988 | European Pat. Off. . |
| 4140018A1 | 6/1993 | Germany . |
| 8500714 | 2/1985 | WIPO . |

*Primary Examiner*—Reba I. Elmore
*Assistant Examiner*—Brian C. Oakes
*Attorney, Agent, or Firm*—Fitzpatrick, Cella, Harper & Scinto

[57] ABSTRACT

A multiplier calculates a product $S'(x)=S(x)\cdot\lambda(x) \mod X^{d-1}$ of a syndrome polynomial $S(x)$ generated by a syndrome generator and an erasure position polynomial $\lambda(x)$ generated by an erasure position polynomial generator, modulo $X^{d-1}$. A constant multiplier sequentially multiplies coefficients of the polynomial $S'(x)$ and the erasure position polynomial $\lambda(x)$ with a power of a primitive root $\alpha$ of a code. The power exponents in this multiplication are determined in units of coefficients. Every time this multiplication is executed, an adder sequentially adds predetermined combinations of products. A plurality of arithmetic and logic operations according to the numbers of correctable erasures and errors are sequentially executed using the sums. A divisor and dividend are selected in accordance with the number of erasures included in the code on the basis of the plurality of arithmetic and logic operation results. A division is executed using the selected divisor and dividend. A value at a position, discriminated to be an error position, of the code is corrected based on the division result, thus performing error correction including erasure correction with a simple circuit arrangement.

8 Claims, 4 Drawing Sheets

ERROR CORRECTION METHOD INCLUDING ERASURE CORRECTION, AND APPARATUS THEREFOR

BACKGROUND OF THE INVENTION

1. Field of the Invention

The present invention relates to an error correction method for detecting and correcting data errors of data storage media such as optical disks, magnetooptical disks, and the like, data communication paths in satellite communications, and the like using error correction codes and, more particularly, to an error correction method using codes defined on a finite field such as Reed Solomon codes (to be referred to as RS codes hereinafter) and an apparatus therefor.

2. Related Background Art

In recent years, in order to improve reliability of various digital systems such as a memory system using a storage medium (e.g., an optical disk), an error correction method using error correction codes is popularly utilized. In particular, as such error correction codes, RS codes are widely used in optical disks, magnetooptical disks, satellite communications, and the like since they have an important feature for practical applications, i.e., they achieve the lowest redundancy among codes having the same code length and correction performance.

However, in a conventional method for processing encoding/decoding of RS codes at high speed, when erasure correction is not considered, and correction performance is as small as about 1 to 2, an apparatus can be relatively easily realized. However, when erasure is taken into consideration, processing is considerably complicated as compared to processing including no erasure correction even when the error correction performance is small.

SUMMARY OF THE INVENTION

It is, therefore, an objective of the present invention to provide a decoding method for performing error correction including erasure correction using a simple circuit arrangement, and an apparatus therefor.

It is another objective of the present invention to provide a decoding method for performing erasure correction at high speed by simple processing, and an apparatus therefor.

According to one aspect, the present invention which achieves these objectives relates to an error correction method comprising the steps of: generating a syndrome polynomial for a code to be corrected; generating an erasure position polynomial for the code to be corrected; calculating partial polynomials corresponding to portions, which have degrees smaller by at least 2 than a designed distance of the code, of a product of the generated syndrome polynomial and the generated erasure position polynomial; executing a multiplication for sequentially multiplying coefficients of the partial polynomials and the erasure position polynomials with a power of a primitive element of the code, power exponents being determined in units of coefficients; sequentially calculating sums of predetermined combinations of products every time the multiplication is executed; selecting a divisor and a dividend in accordance with the number of erasures included in the code on the basis of results of a plurality of predetermined arithmetic and logic operations which are sequentially executed using the sums; executing a division using the selected divisor and dividend; discriminating, based on the results of the predetermined arithmetic and logic operations which are sequentially executed using the sums, whether or not each of positions of the code is an error position; and correcting values of the code at the positions determined to be the error positions and at erasure positions on the basis of the result of the division.

According to another aspect, the present invention which achieves these objectives relates to an error correction apparatus comprising: first generation means for generating a syndrome polynomial for a code to be corrected; second generation means for generating an erasure position polynomial for the code to be corrected; first arithmetic operation means for calculating partial polynomials corresponding to portions, which have degrees smaller by at least 2 than a designed distance of the code, of a product of the syndrome polynomial and the erasure position polynomial respectively generated by the first and second generation means; multiplication means for sequentially multiplying coefficients of the partial polynomials and the erasure position polynomials with a power of a primitive element of the code, power exponents being determined in units of coefficients; addition means for sequentially calculating sums of predetermined combinations of products every time the multiplication means executes the multiplication; second arithmetic operation means for sequentially executing a plurality of predetermined arithmetic and logic operations using the sums; selection means for selecting a divisor and a dividend in accordance with the number of erasures included in the code on the basis of a plurality of arithmetic operation results from the second arithmetic operation means; division means for executing a division using the divisor and dividend selected by the selection means; discrimination means for discriminating, based on the arithmetic operation results from the second arithmetic operation means, whether or not each of positions of the code is an error position; and correction means for correcting values of the code at the positions determined to be the error positions and at erasure positions on the basis of the division result from the division means.

According to still another aspect, the present invention which achieves these objectives relates to an error correction method comprising the steps of: generating a syndrome polynomial for a code to be corrected; generating an erasure position polynomial for the code to be corrected; calculating partial polynomials corresponding to portions, which have degrees smaller by at least 2 than a designed distance of the code, of a product of the generated syndrome polynomial and the generated erasure position polynomial; calculating a value at an error position of a polynomial obtained by altering a degree of the erasure position polynomial; and calculating a magnitude of a single error by dividing the coefficients of the partial polynomials with the calculated value.

According to another aspect, the present invention which achieves these objectives relates to an error correction apparatus comprising: first generation means for generating a syndrome polynomial for a code to be corrected; second generation means for generating an erasure position polynomial for the code to be corrected; first arithmetic operation means for calculating partial polynomials corresponding to portions, which have degrees smaller by at least 2 than a designed distance of the code, of a product of the syndrome polynomial and the erasure position polynomial respectively generated by the first and second generation means; second arithmetic operation means for calculating a value at an error position of a polynomial obtained by altering a degree of the erasure position polynomial; and third arithmetic operation means for calculating a magnitude of a single error by dividing the coefficients of the partial polynomials calculated by the first arithmetic operation means with the calculated value calculated by the second arithmetic operation means.

Other objectives and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

The preferred embodiments of the present invention will be described in detail hereinafter with reference to the accompanying drawings.

(First Embodiment)

For the sake of simplicity, a case of RS codes with a designed distance="5" will be explained below. In RS codes, since a minimum distance d is equal to the designed distance, d=5. In general, if the number of errors is represented by t, and the number of erasures is represented by s, $d \geq 2t+s+1$ is satisfied. For this reason, when d=5, a total of the numbers of correctable errors and erasures is at most 4, and correctable combinations are as follows. That is, when the number of erasures is 3 to 4, the number of errors is 0; when the number of erasures is 1 to 2, the number of errors is 1; and when the number of erasures is 0, the number of errors is 4. Thus, in the following description, the code length of RS codes is represented by n, and of 0th to (n−1)th positions in a code unit, the positions of errors or erasures are represented by h, i, j, and k. In correction, assume that the position of an erasure is obtained but its magnitude is unknown, and neither of the position and magnitude of an error are known. Also, the primitive root of the nth power of 1 is represented by $\alpha$.

Figure 1:
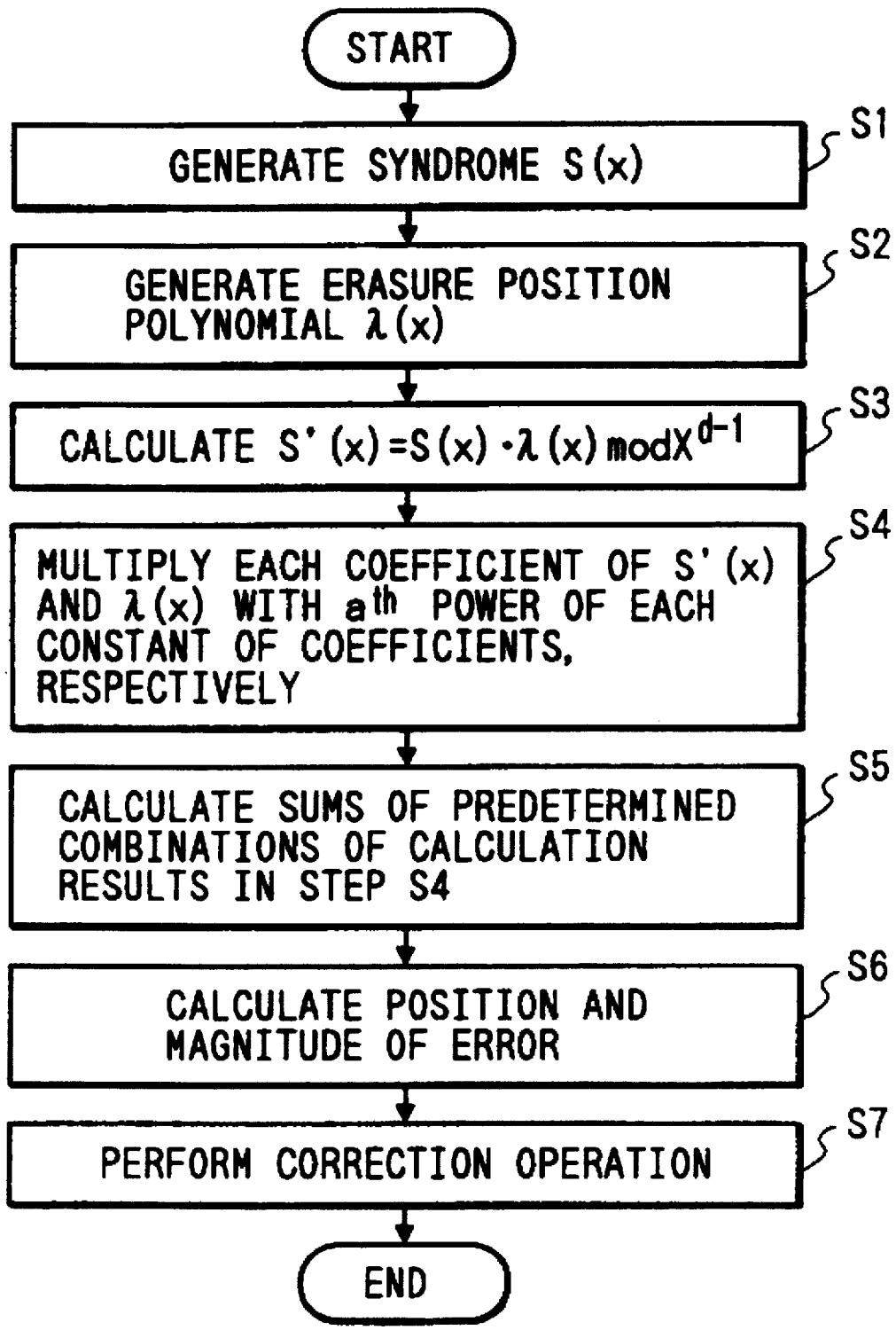
FIG. 1 is a flow chart showing the processing sequence of an error correction apparatus according to an embodiment of the present invention.

A decoding sequence of a received word as the principle of the present invention will be described below with reference to the flow chart in FIG. 1. In step S1, if a received word polynomial is represented by W(x), the following syndrome polynomial is generated based on $S_m = W(\alpha^m)$:

$$S(x) = S_3 \cdot x^3 + S_2 \cdot x^2 + S_1 \cdot x + S_0$$

More specifically, we have:

$$S_0 = e_h + e_i + e_j + e_k$$

$$S_1 = \alpha^h \cdot e_h + \alpha^i \cdot e_i + \alpha^j \cdot e_j + \alpha^k \cdot e_k$$

$$S_2 = \alpha^{2h} \cdot e_h + \alpha^{2i} \cdot e_i + \alpha^{2j} \cdot e_j + \alpha^{2k} \cdot e_k$$

$$S_3 = \alpha^{3h} \cdot e_h + \alpha^{3i} \cdot e_i + \alpha^{3j} \cdot e_j + \alpha^{3k} \cdot e_k$$

Then, in step S2, an erasure position polynomial $\lambda(x) = \lambda_3 \cdot x^3 + \lambda_2 \cdot x^2 + \lambda_1 \cdot x + \lambda_0$ is generated. More specifically, we have:

$$\lambda_4 = \alpha^{h+i+j+k}$$

$$\lambda_3 = \alpha^{h+i+j} + \alpha^{h+i+k} + \alpha^{h+j+k} + \alpha^{i+j+k}$$

$$\lambda_2 \alpha^{h+i} + \alpha^{h+j} + \alpha^{h+k} + \alpha^{i+k} + \alpha^{j+k}$$

$$\lambda_1 = \alpha^h + \alpha^i + \alpha^j + \alpha^k$$

$$\lambda_0 = 1$$

In step S3, a product of the syndrome polynomial S(x) and the erasure position polynomial $\mu(x)$, modulo $X^{d-1}$, is calculated as follows:

$$\begin{aligned} S'(x) &= S(x) \cdot \lambda(x) \bmod X^{d-1} \\ &= S'_3 \cdot x^3 + S'_2 \cdot x^2 + S'_1 \cdot x + S'_0 \end{aligned}$$

More specifically, we have:

$$S'_3 = S_3\lambda_0 + S_2\lambda_1 + S_1\lambda_2 + S_0\lambda_3$$

$$S'_2 = S_2\lambda_0 + S_1\lambda_1 + S_0\lambda_2$$

$$S'_1 = S_1\lambda_0 + S_0\lambda_1$$

$$S'_0 = S_0\lambda_0$$

Furthermore, in step S4, the coefficients, S'(x) and $\lambda(x)$, are multiplied with $\alpha^{-1}$, $\alpha^{-2}$, or $\alpha^{-3}$ a times ($0 \leq a \leq n-1$) as follows:

$$S_{x3} = S'_3 \cdot (\alpha^{-3})^a$$

$$S_{x2} = S'_2 \cdot (\alpha^{-2})^a$$

$$S_{x1} = S'_1 \cdot (\alpha^{-1})^a$$

$$\lambda_{x3} = \lambda_3 \cdot (\alpha^{-3})^a$$

$$\lambda_{x2} = \lambda_2 \cdot (\alpha^{-2})^a$$

$$\lambda_{x1} = \lambda_1 \cdot (\alpha^{-1})^a$$

In step S5, sums of the calculation results in step S4 for each a are calculated:

$$A_{x2} = S_{x3} + S_{x2}$$

$$A_{x1} = S_{x2} + S_{x1}$$

$$A_{x0} = S_{x1} + S_0$$

$$B_{x2} = \lambda_{x3} + \lambda_{x1}$$

$$B_{x1} = \lambda_{x2} + \lambda_{x1}$$

Using the above results, in step S6, the position and magnitude of an error are calculated by the following calculations:

When the number of erasures is 0, double error position:

position of a satisfying $L2 = A_{x0} \cdot A_{x2} + A_{x1}^2 = 0$ single error position:

position of a satisfying $L1 = A_{x2} = 0$ magnitude of error:

$$EI = S_0 A_{x0}^2 / (A_{x0} + A_{x1})$$

When the number of errors is 1 to 2, error position:

position of a satisfying $L1 = A_{x2} = 0$ magnitude of error:

$$EI = S_{x2}/(B_{x1}+1)$$

magnitude of erasure:

$$EJ = (A_{x2} \cdot A_{x0} + S_{x2}^2)/(A_{x2} \cdot \lambda_{x1})$$

When the number of errors is 3 to 4, magnitude of erasure:

$$EJ = (A_{x2} = A_{x0})/B_{x2}$$

Finally, in step S7, a correction operation is performed at the positions, which are determined to be error positions, on the basis of the error magnitudes.

Equations shown in step S6 will be proved below.

When the number of erasures is 3 to 4, the number of errors is 0, as described above, and all h, i, j, and k are erasures. At this time, since we have:

$$\begin{aligned}
S_{x1} &= S'_1 \cdot (\alpha^{-1})^e \\
&= (S_1 \lambda_0 + S_0 \lambda_1) \cdot (\alpha^{-1})^e \\
&= \{(\alpha^h \cdot e_h + \alpha^i \cdot e_i + \alpha^j \cdot e_j + \alpha^k \cdot e_k) \cdot 1 + \\
&\quad (e_h + e_i + e_j + e_k) \cdot (\alpha^h + \alpha^i + \alpha^j + \alpha^k)\} \cdot \\
&\quad (\alpha^{-1})^e \\
&= \{(\alpha^i + \alpha^j + \alpha^k) \cdot e_h + (\alpha^h + \alpha^j + \alpha^k) \cdot e_i + \\
&\quad (\alpha^h + \alpha^i + \alpha^k) \cdot e_j + (\alpha^h + \alpha^i + \alpha^j) \cdot e_k\} \cdot \\
&\quad (\alpha^{-1})^e \\
S_{x2} &= S'_2 \cdot (\alpha^{-2})^e \\
&= (S_2 \lambda_0 + S_1 \lambda_1 + S_0 \lambda_2) \cdot (\alpha^{-2})^e \\
&= \{(\alpha^{2h} \cdot e_h + \alpha^{2i} \cdot e_i + \alpha^{2j} \cdot e_j + \alpha^{2k} \cdot e_k) \cdot 1 + \\
&\quad (\alpha^h \cdot e_h + \alpha^i \cdot e_i + \alpha^j \cdot e_j + \alpha^k \cdot e_k) \cdot \\
&\quad (\alpha^h + \alpha^i + \alpha^j + \alpha^k) + \\
&\quad (e_h + e_i + e_j + e_k) \cdot \\
&\quad (\alpha^{h+i} + \alpha^{h+j} + \alpha^{h+k} + \alpha^{i+j} + \alpha^{i+k} + \alpha^{j+k})\} \cdot \\
&\quad (\alpha^{-2})^e \\
&= \{(\alpha^{i+j} + \alpha^{i+k} + \alpha^{j+k}) \cdot e_h + \\
&\quad (\alpha^{h+j} + \alpha^{h+k} + \alpha^{j+k}) \cdot e_i + \\
&\quad (\alpha^{h+i} + \alpha^{h+k} + \alpha^{i+k}) \cdot e_j + \\
&\quad (\alpha^{h+i} + \alpha^{h+j} + \alpha^{i+j}) \cdot e_k\} \cdot (\alpha^{-2})^e
\end{aligned}$$

$$\begin{aligned}
S_{x3} &= S'_3 \cdot (\alpha^{-3})^e \\
&= (S_3 \lambda_0 + S_2 \lambda_1 + S_1 \lambda_2 + S_0 \lambda_3) \cdot (\alpha^{-3})^e \\
&= \{(\alpha^{3h} \cdot e_h + \alpha^{3i} \cdot e_i + \alpha^{3j} \cdot e_j + \alpha^{3k} \cdot e_k) \cdot 1 + \\
&\quad (\alpha^{2h} \cdot e_h + \alpha^{2i} \cdot e_i + \alpha^{2j} \cdot e_j + \alpha^{2k} \cdot e_k) \cdot \\
&\quad (\alpha^h + \alpha^i + \alpha^j + \alpha^k) + \\
&\quad (\alpha^h \cdot e_h + \alpha^i \cdot e_i + \alpha^j \cdot e_j + \alpha^k \cdot e_k) \cdot \\
&\quad (\alpha^{h+i} + \alpha^{h+j} + \alpha^{h+k} + \alpha^{i+j} + \alpha^{i+k} + \alpha^{j+k}) + \\
&\quad (e_h + e_i + e_j + e_k) \cdot \\
&\quad (\alpha^{h+i+j} + \alpha^{h+i+k} + \alpha^{h+j+k} + \alpha^{i+j+k})\} \cdot (\alpha^{-3})^e \\
&= (\alpha^{i+j+k} \cdot e_h + \alpha^{h+j+k} \cdot e_i + \alpha^{h+i+k} \cdot e_j + \alpha^{h+i+j} \cdot e_k) \cdot \\
&\quad (\alpha^{-3})^e
\end{aligned}$$

then, when, for example, a=h, we can prove:

$$\begin{aligned}
(A_{x2} + A_{x0})/B_{x2} &= (S_{x3} + S_{x2} + S_{x1} + S_0)/(\lambda_{x3} + \lambda_{x1}) \\
&= (\alpha^{i+j+k-3h} + \alpha^{i+j-2h} + \alpha^{i+k-2h} + \alpha^{j+k-2h} + \\
&\quad \alpha^{i-h} + \alpha^{j-h} + \alpha^{k-h} + 1) \cdot e_h / \\
&\quad \{(\alpha^{h+i+j} + \alpha^{h+i+k} + \alpha^{h+j+k} + \alpha^{i+j+k}) \cdot \alpha^{-3h} + \\
&\quad (\alpha^h + \alpha^i + \alpha^j + \alpha^k) \cdot \alpha^{-h}\} \\
&= e_h
\end{aligned}$$

The same applies to a=i, j, and k.

A case will be examined below wherein the number of erasures is 1 to 2. At this time, the number of errors is 1, as described above. Thus, J and k are assumed to be the erasure positions, and i is assumed to be the error position. At this time, since we have:

$$\begin{aligned}
S_{x1} &= S'_1 \cdot (\alpha^{-1})^e \\
&= (S_1 \lambda_0 + S_0 \lambda_1) \cdot (\alpha^{-1})^e \\
&= \{(\alpha^i \cdot e_i + \alpha^j \cdot e_j + \alpha^k \cdot e_k) \cdot 1 + \\
&\quad (e_i + e_j + e_k) \cdot (\alpha^j + \alpha^k)\} \cdot \\
&\quad (\alpha^{-1})^e \\
&= \{(\alpha^j + \alpha^k) \cdot e_i + \alpha^k + e_j + \alpha^j \cdot e_k\} \cdot (\alpha^{-1})^e \\
S_{x2} &= S'_2 \cdot (\alpha^{-2})^e \\
&= (S_2 \lambda_0 + S_1 \lambda_1 + S_0 \lambda_2) \cdot (\alpha^{-2})^e \\
&= \{(\alpha^{2i} \cdot e_i + \alpha^{2j} \cdot e_j + \alpha^{2k} \cdot e_k) \cdot 1 + \\
&\quad (\alpha^i \cdot e_i + \alpha^j \cdot e_j + \alpha^k \cdot e_k) \cdot (\alpha^j + \alpha^k) + \\
&\quad (e_i + e_j + e_k) \cdot \alpha^{j+k}\} \cdot (\alpha^{-2})^e \\
&= (\alpha^{2i} + \alpha^{i+j} + \alpha^{i+k} + \alpha^{j+k}) \cdot e_i \cdot (\alpha^{-2})^e \\
S_{x3} &= S'_3 \cdot (\alpha^{-3})^e \\
&= (S_3 \lambda_0 + S_2 \lambda_1 + S_1 \lambda_2 + S_0 \lambda_3) \cdot (\alpha^{-3})^e \\
&= \{(\alpha^{3i} \cdot e_i + \alpha^{3j} \cdot e_j + \alpha^{3k} \cdot e_k) \cdot 1 + \\
&\quad (\alpha^{2i} \cdot e_i + \alpha^{2j} \cdot e_j + \alpha^{2k} \cdot e_k) \cdot (\alpha^j + \alpha^k) + \\
&\quad (\alpha^i \cdot e_i + \alpha^j \cdot e_j + \alpha^k \cdot e_k) \cdot \alpha^{j+k}\} \cdot (\alpha^{-3})^e \\
&= (\alpha^{2i} + \alpha^{i+j} + \alpha^{i+k} + \alpha^{j+k}) \cdot e_i \cdot \alpha^i \cdot (\alpha^{-3})^e
\end{aligned}$$

then,

-continued $$A_{x2} = S_{x3} + S_{x2}$$
$$= (\alpha^{2i} + \alpha^{i+j} + \alpha^{i+k} + \alpha^{j+k}) \cdot e_i \cdot (\alpha^{-3})^i \cdot (\alpha^j + \alpha^a)$$

Therefore, only when a=i, $A_{x2}$=0. For this reason, by checking the value of $A_{x2}$, the error position can be detected.

When a=i, $S_{x2}/(B_{x1}+1)=e_i$, and this calculation yields the magnitude of the error. Furthermore, when a=J, $(A_{x2} \cdot A_{x0} = S_{x2}^2)/(A_{x2} \cdot \lambda_{x1})=e_j$, and similarly, when a=k, this results in $e_k$, thus obtaining erasure values.

Finally, when the number or erasures is 0, a correction technique for this case is known to those who are skilled in the art, and a detailed description thereof will be omitted. According to the present invention, when the number of erasures is 0, a conventional method is used, and when the number of erasures is 1 or more, the method of the present invention is used. Therefore, processing can be performed by a simple arrangement independently of the presence/absence of erasures.

Figure 2:
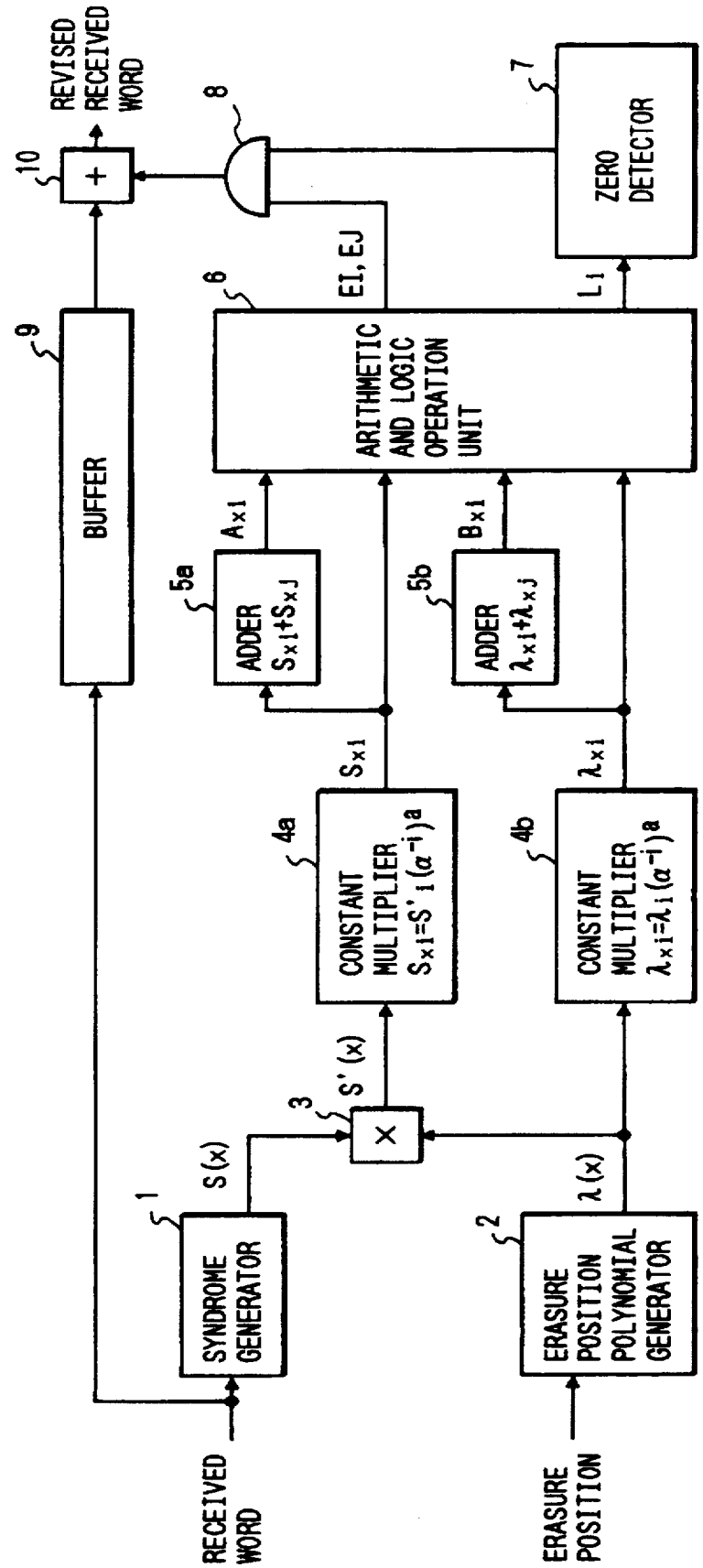
FIG. 2 is a block diagram showing the arrangement of an error correction apparatus of the first embodiment.

FIG. 2 shows the circuit arrangement based on the above-mentioned decoding sequence. Referring to FIG. 2, a syndrome generator 1 generates a syndrome polynomial S(x) from a received word in step S1. An erasure position polynomial generator 2 generates an erasure position polynomial $\lambda(x)$ in step S2 on the basis of a given erasure position. A multiplier 3 performs multiplication in step S3 for calculating the product $S'(x)=S(x)\cdot\lambda(x)$ mod $X^{d-1}$ of the syndrome polynomial S(x) and the erasure position polynomial $\lambda(x)$, modulo $X^{d-1}$. A constant multiplier 4 executes processing in step S4 for multiplying a constant $\alpha^{-i}$ with the respective coefficients in the polynomial. An adder 5 adds the coefficients in the polynomial in step S5. An arithmetic and logic operation unit 6 executes an arithmetic operation in step S6 for calculating the position and magnitude of an error and the magnitude of an erasure.

In the correction operation, L1 or L2=0 for each position of codes sequentially output via a buffer 9 is detected by a zero detector 7 to discriminate an error position. When 0 is detected, EI is passed by an AND gate 8, and an adder 10 corrects the error. At the erasure position known in advance, the adder 10 corrects the erasure using EJ.

Figure 3:
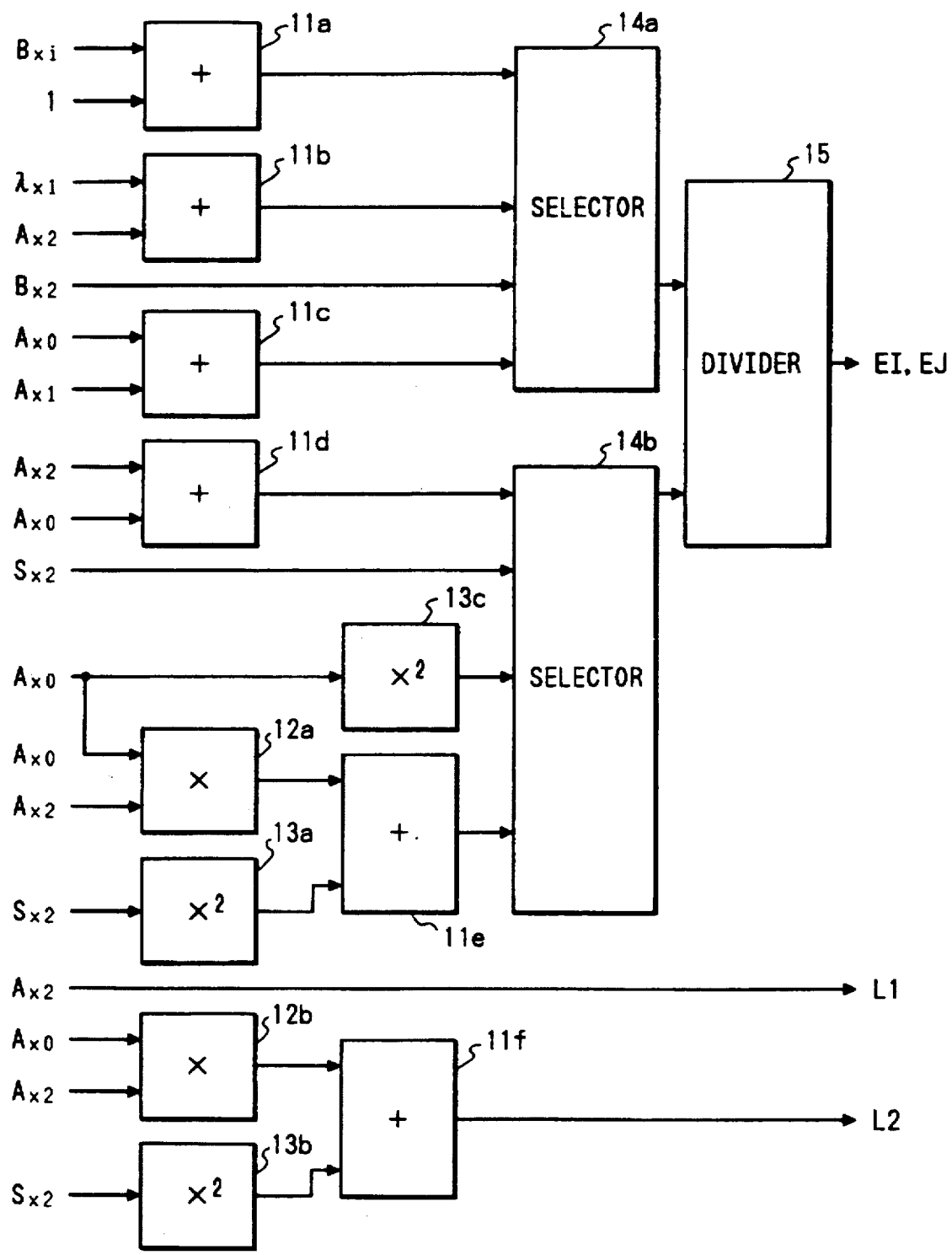
FIG. 3 is a block diagram showing the detailed arrangement of a circuit for calculating the position and magnitude of an error in the first embodiment.

FIG. 3 is a circuit diagram showing the detailed arrangement of the arithmetic and logic operation circuit 6. Each of adders 11a to 11f adds two inputs, and outputs a sum. Each of multipliers 12a and 12b outputs a product of two inputs. Each of square circuits 13a to 13c outputs a square of an input. Each of selectors 14a and 14b selects one output from four inputs in accordance with the number and positions of erasures. A divider 15 executes division using the output from the selector 14a as a divisor and the output from the selector 14b as a dividend, and outputs the magnitude EI of an error or the magnitude EJ of an erasure. More specifically, when the number of erasures is 3 to 4, the selector 14a selects $B_{x2}$, and the selector 14b selects the output from the adder 11d. When the number of erasures is 1 to 2, at the positions of erasures, the selector 14a selects the output from the adder 11b and the selector 14b selects the output from the adder 11e, and at other positions, the selector 14a selects the output from the adder 11b and the selector 14b selects $S_{x2}$. When the number of erasures is 0, the selector 14a selects the output from the adder 11c, and the selector 14b selects the output from the square circuit 13c. The divider 15 obtains the reciprocal number of a divisor by reciprocal number conversion based on a table such as a ROM, and calculates a product of the obtained reciprocal number and a dividend. When the number of erasures is 0, EI is obtained by further adding $S_0$ to the output from the divider 15. In FIG. 3, inputs of the same values and same arithmetic operations are separately illustrated. However, on an actual circuit, these components may be connected to be able to commonly use the same values.

As described above, according to this embodiment, an error including an erasure can be corrected by a simple circuit arrangement.

(Second Embodiment)

As the second embodiment of the present invention, a circuit for correcting a single error irrespective of generation of an erasure will be described below.

For the sake of simplicity, as in the first embodiment, a case of RS codes with a minimum distance d=5 will be explained. A case will be examined below wherein the number of erasures is 1 to 2. At this time, the number of correctable errors is 1, as described above. Thus, J and k are assumed to be the erasure positions and i is assumed to be the error position. At this time, the syndrome polynomial S(x) is given by:

$$S(x)=S_3 \cdot x^3 + S_2 \cdot x^2 + S_1 \cdot x + S_0$$

$$S_0 = e_i + e_j + e_k$$

$$S_1 = \alpha^i \cdot e_i + \alpha^j \cdot e_j + \alpha^k \cdot e_k$$

$$S_2 = \alpha^{2i} \cdot e_i + \alpha^{2j} \cdot e_j + \alpha^{2k} \cdot e_k$$

$$S_3 = \alpha^{3i} \cdot e_i + \alpha^{3j} \cdot e_j + \alpha^{3k} \cdot e_k$$

On the other hand, the erasure position polynomial $\lambda(x)$ is given by:

$$\lambda(x) = \lambda_2 \cdot x^2 + \lambda_1 \cdot x + \lambda_0$$
$$= \alpha^{j+k} \cdot x^2 + (\alpha^j + \alpha^k) \cdot x + 1$$

Therefore, when a product $S'(x)=S(x)\cdot\lambda(x)$ mod $X^{d-1} = S'_3 \cdot x^3 + S'_2 \cdot x^2 + S'_1 \cdot x + S'_0$ of the syndrome polynomial S(x) and the erasure position polynomial $\lambda(x)$, modulo $X^{d-1}$, is calculated, we have:

$$S'_3 = S_3\lambda_0 + S_2\lambda_1 + S_1\lambda_2 + S_0\lambda_3$$

$$S'_2 = S_2\lambda_0 + S_1\lambda_1 + S_0\lambda_2$$

$$S'_1 = S_1\lambda_0 + S_0\lambda_1$$

$$S'_0 = S_0\lambda_0$$

In particular, $$S'_3 = e_i \cdot \alpha^{3i} \cdot \lambda(\alpha^{-i})$$

$$S'_2 = e_i \cdot \alpha^{2i} \cdot \lambda(\alpha^{-i})$$

Therefore, the position i and magnitude $e_i$ of an error can be respectively calculated by:

$$\alpha^{-i} = S'_2/S'_3$$

$$e_i = S'_3/(\lambda(\alpha^{-i}) \cdot \alpha^{3i})$$

When $\alpha^{-i}$ is expressed by x, $(\lambda(x) \cdot x^{-3})$ in an equation for calculating $e_i$ corresponds to a pattern obtained by altering the degree of the erasure position polynomial.

When $e_i$ is expressed as $e_i = S'_3 \alpha^{-3i}/\lambda(\alpha^{-i})$ $e_i$ corresponds to a pattern obtained by multiplying $S'_3$ with a constant $a^{-3i}$ and dividing the product with the erasure position polynomial $\lambda(\alpha^{-i})$.

Figure 4:
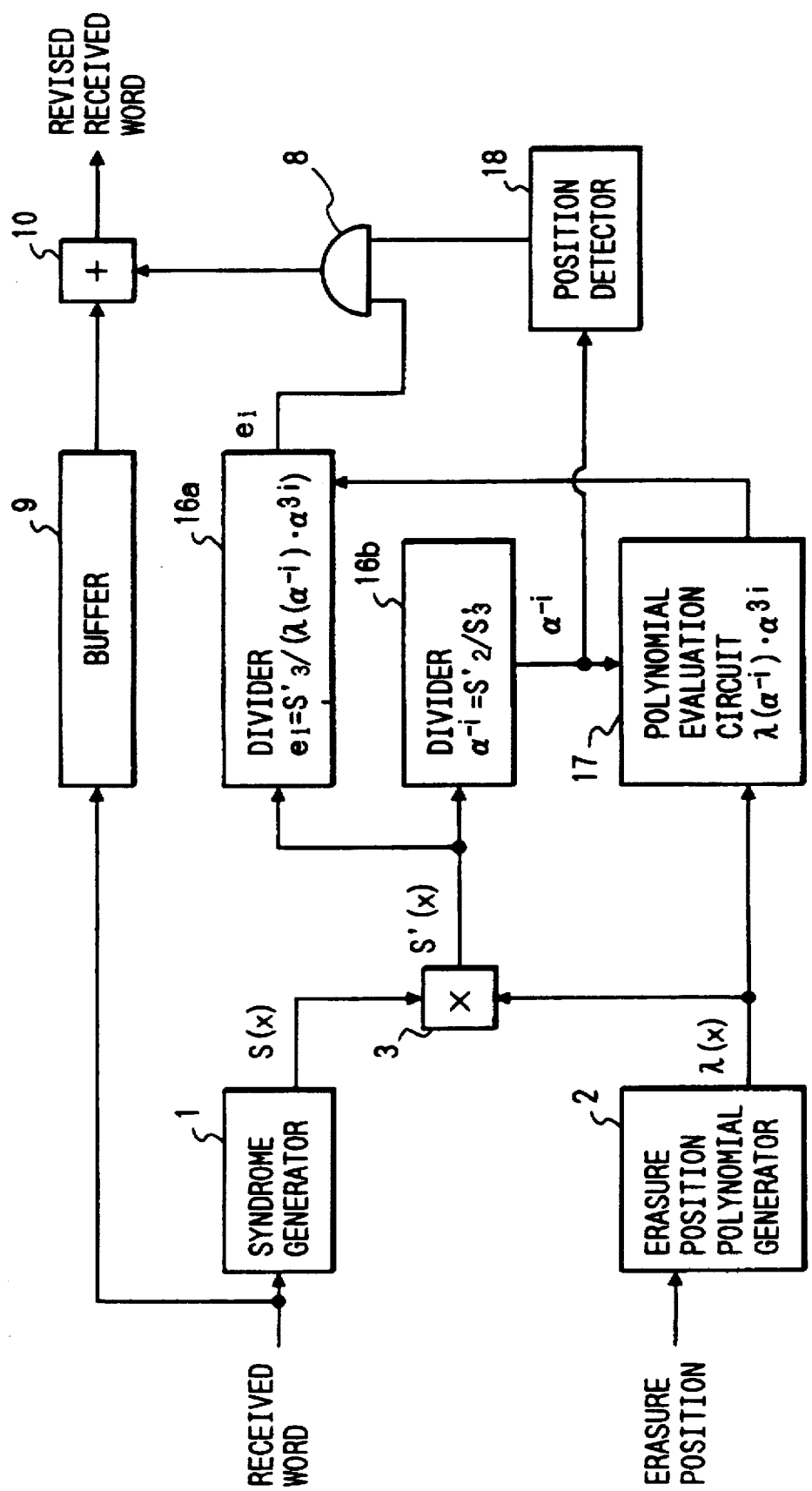
FIG. 4 is a block diagram showing the arrangement of an error correction apparatus of the second embodiment.

Therefore, arithmetic operations required for the above-mentioned method can be realized by an apparatus shown in FIG. 4. Referring to FIG. 4, a syndrome generator 1 generates a syndrome polynomial S(x) from a received word. An erasure position polynomial generator 2 generates an erasure position polynomial λ(x) on the basis of a given erasure position. A multiplier 3 calculates a product S'(x)=S(x)·λ(x) mod $X^{d-1}$ of the syndrome polynomial S(x) and the erasure position polynomial λ(x), modulo $X^{d-1}$. The above-mentioned circuits are the same as those in the first embodiment. Also, each of dividers 16a and 16b obtains the reciprocal number of a divisor by reciprocal number conversion based on a table such as a ROM, and calculates a product of the obtained reciprocal number and a dividend. A polynomial evaluation circuit 17 obtains a new polynomial $λ(x) \cdot x^{-1}$ by altering the degree of the erasure position polynomial λ(x) generated by the erasure position polynomial generator 2, and then calculates a value obtained by substituting $\alpha^{-i}$ in the new polynomial. As can be understood from the fact that a polynomial A(x) can be expressed by:

$$A(x) = a_n \cdot x^n + a_{n-1} \cdot x^{n-1} + \ldots + a_1 \cdot x + a_0$$
$$= ((\ldots(a_n \cdot x + a_{n-1}) \cdot x + a_{n-2}) \ldots) \cdot x + a_0$$

such a polynomial evaluation circuit can be realized by repeating a multiplication/addition in the form of A·X+B. This multiplication/addition is realized by a repetitive arithmetic operation using a single circuit or parallel processing using a plurality of circuits. A position detector 18 opens an AND gate 8 at an error position i on the basis of a $a^{31\ i}$ output from the divider 16, and an adder 10 corrects a code output from a buffer 9 as in the first embodiment.

As described above, according to this embodiment, a single error can be corrected by a simple circuit arrangement independently of generation of erasures.

Although the present invention has been described in its preferred form with a certain degree of particularity, many apparently widely different embodiments of the invention can be made without departing from the spirit and scope thereof. It is to be understood that the invention is not limited to the specific embodiments thereof except as defined in the appended claims.

What is claimed is:

1. An error correction method comprising the steps of:

generating a syndrome polynomial for a code to be corrected;

generating an erasure position polynomial for the code to be corrected;

calculating partial polynomials corresponding to portions, which have degrees smaller by at least 2 than a designed distance of the code, of a product of the generated syndrome polynomial and the generated erasure position polynomial;

executing a multiplication for sequentially multiplying coefficients of the partial polynomials and the erasure position polynomials with a power of a primitive element of the code, power-exponents being determined in units of coefficients;

sequentially calculating sums of predetermined combinations of products every time the multiplication is executed;

selecting a divisor and a dividend, in accordance with the number of erasures and positions of the erasures included in the code, from among results of a plurality of predetermined arithmetic and logic operations which are sequentially executed using the sums;

executing a division using the selected divisor and dividend;

discriminating, based on the results of the predetermined arithmetic and logic operations which are sequentially executed using the sums, whether or not each of positions of the code is an error position; and correcting values of the code at the positions determined to be the error positions and at erasure positions on the basis of the result of the division.

2. A method according to claim 1, wherein the plurality of arithmetic and logic operations, results of which are selected for different numbers of erasures and positions are parallelly executed at each of the positions of the code.

3. A method according to claim 1, wherein the discrimination and correction steps are sequentially executed in correspondence with the positions.

4. An error correction apparatus comprising:

first generation means for generating a syndrome polynomial for a code to be corrected;

second generation means for generating an erasure position polynomial for the code to be corrected;

first arithmetic operation means for calculating partial polynomials corresponding to portions, which have degrees smaller by at least 2 than a designed distance of the code, of a product of the syndrome polynomial and the erasure position polynomial respectively generated by said first and second generation means;

multiplication means for sequentially multiplying coefficients of the partial polynomials and the erasure position polynomials with a power of a primitive element of the code, power exponents being determined in units of coefficients;

addition means for sequentially calculating sums of predetermined combinations of products every time said multiplication means executes the multiplication;

second arithmetic operation means for sequentially executing a plurality of predetermined arithmetic and logic operations using the sums;

selection means for selecting a divisor and a dividend, in accordance with the number of erasures and positions of the erasures included in the code, from among a plurality of arithmetic operations results from said second arithmetic operation means;

division means for executing a division using the divisor and dividend selected by said selection means;

discrimination means for discriminating, based on the arithmetic operation results from said second arithmetic operation means, whether or not each of positions of the code is an error portion; and correction means for correcting values of the code at the positions determined to be the error positions and at erasure positions on the basis of the division result from said division means.

5. An apparatus according to claim 4, wherein said second arithmetic operation means parallelly executes the plurality of arithmetic and logic operations, results of which are selected for different numbers of erasures and positions at each of the positions of the code.

6. An apparatus according to claim 4, wherein the discrimination by said discrimination means and the correction by said correction means are sequentially executed in correspondence with the positions.

7. An error correction method comprising the steps of:

generating a syndrome polynomial for a code to be corrected;

generating an erasure position polynomial for the code to be corrected;

calculating partial polynomials corresponding to portions, which have degrees smaller by at least 2 than a designated distance of the code, of a product of the generated syndrome polynomial and the generated erasure position polynomial;

calculating a value at an error position of a polynomial obtained by altering a degree of the erasure position polynomial;

calculating an error value of a single error by dividing the coefficients of the partial polynomials with the calculated value;

determining error positions using the coefficients of the partial polynomials; and correcting values of the code at the positions determined to be error positions by using the calculated error value.

8. An error correction apparatus comprising:

first generation means for generating a syndrome polynomial for a code to be corrected;

second generation means for generating an erasure position polynomial for the code to be corrected;

first arithmetic operation means for calculating partial polynomials corresponding to portions, which have degrees smaller by at least 2 than a designed distance of the code, of a product of the syndrome polynomial and the erasure position polynomial respectively generated by said first and second generation means;

second arithmetic operation means for calculating a value at an error position of a polynomial obtained by altering a degree of the erasure position polynomial;

third arithmetic operation means for calculating an error value of a single error by dividing the coefficients of the partial polynomials calculated by said first arithmetic operation means with the calculated value calculated by said second arithmetic operation means;

position determination means for determining error positions using the coefficients of the partial polynomials; and correcting means for correcting values of the code at the positions determined to be the error positions by using the calculated error value.

* * * * *

UNITED STATES PATENT AND TRADEMARK OFFICE
CERTIFICATE OF CORRECTION

PATENT NO. : 5,694,330

DATED : December 2, 1997

INVENTOR(S): KEIICHI IWAMURA ET AL.                Page 1 of 4

It is certified that error appears in the above-identified patent and that said Letters Patent is hereby corrected as shown below:

COLUMN 4

Line 2, "$S_3=\alpha^{3h} \cdot e_{hli+\alpha}{}^{3i} \cdot e_i+\alpha^{3j} \cdot e_j+\alpha^{3k} \cdot e_k$" should read
--$S_3=\alpha^{3h} \cdot e_h+\alpha^{3i} \cdot e_i+\alpha^{3j} \cdot e_j+\alpha^{3k} \cdot e_k$--;

Line 11, "$\lambda_2\alpha^{h+i}+\alpha^{h+j}+\alpha^{h+k}+\alpha^{i+k}+\alpha^{j+k}$" should read
--$\lambda_2=\alpha^{h+i}+\alpha^{h+j}+\alpha^{h+k}+\alpha^{i+k}+\alpha^{j+k}$--;

Line 17, "polynomial $\mu(x)$," should read --polynomial $\lambda(x)$,--;

Line 33, "$\alpha^{=1}$, $\alpha^{=2}$, or $\alpha^{=3}$" should read --$\alpha^{-1}$, $\alpha^{-2}$, or $\alpha^{-3}$--;

Line 44, "$_{x1}=\lambda_1 \cdot (\alpha^{-1})^a$" should read --$\lambda_{x1}=\lambda_1 \cdot (\alpha^{-1})^a$--.

UNITED STATES PATENT AND TRADEMARK OFFICE
CERTIFICATE OF CORRECTION

PATENT NO. : 5,694,330

DATED : December 2, 1997

INVENTOR(S): KEIICHI IWAMURA ET AL.    Page 2 of 4

It is certified that error appears in the above-identified patent and that said Letters Patent is hereby corrected as shown below:

COLUMN 5

Line 4, "$EI=S_0A_{x0}^2/(A_{x0}+A_{x1})$" should read
--$EI=S_0+A_{x0}^2/(A_{x0}+A_{x1})$--;

Line 26, "$EJ=(A_{x2}=A_{xo})/B_{x2}$" should read
--$EJ=(A_{x2}+A_{xo})/B_{x2}$--;

Line 62, "{" should be deleted;

Line 63, "{" should be deleted;

Line 65, "{" should be deleted.

COLUMN 6

Line 34, "J" should read --j--;

Line 45, "$\alpha^k+e_i$" should read --$\alpha^k \cdot e_j$--.

UNITED STATES PATENT AND TRADEMARK OFFICE
CERTIFICATE OF CORRECTION

PATENT NO. : 5,694,330

DATED : December 2, 1997

INVENTOR(S): KEIICHI IWAMURA ET AL.   Page 3 of 4

It is certified that error appears in the above-identified patent and that said Letters Patent is hereby corrected as shown below:

COLUMN 7

Line 8, "a=J," should read --a=j,--; and "$A_{xo}=$" should read --$A_{xo}+$--;

Line 44, "11f" should read --11d--.

COLUMN 8

Line 27, "$e_{j+\alpha}{}^{3k}\cdot$" should read -- $e_j+\alpha^{3k}\cdot$ --;

Line 55, "$\alpha^{-1}=s'_2/S'_3$" should read --$\alpha^{-1}=S'_2/S'_3$ --;

Line 62, "$(\alpha^{-i})$" should read --$(\alpha^{-i})$,

Line 63, "$a^{-3i}$" should read --$\alpha^{-3i}$--.

UNITED STATES PATENT AND TRADEMARK OFFICE
CERTIFICATE OF CORRECTION

PATENT NO. : 5,694,330

DATED : December 2, 1997

INVENTOR(S): KEIICHI IWAMURA ET AL.

It is certified that error appears in the above-identified patent and that said Letters Patent is hereby corrected as shown below:

COLUMN 9

Line 28, "$a^{31 i}$" should read --$\alpha^{-1}$--.

COLUMN 10

Line 48, "portion;" should read --position;--.

Signed and Sealed this

Seventh Day of July, 1998

Attest:

BRUCE LEHMAN

Attesting Officer

Commissioner of Patents and Trademarks